(12) United States Patent
Seo et al.

(10) Patent No.: US 7,728,373 B2
(45) Date of Patent: Jun. 1, 2010

(54) DRAM DEVICE WITH CELL EPITAXIAL LAYERS PARTIALLY OVERLAP BURIED CELL GATE ELECTRODE

(75) Inventors: Hyeoung-Won Seo, Yongin-si (KR); Jae-Man Yoon, Seoul (KR); Kang-Yoon Lee, Seongnam-si (KR); Bong-Soo Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 355 days.

(21) Appl. No.: 11/705,109

(22) Filed: Feb. 12, 2007

(65) Prior Publication Data
US 2007/0284647 A1    Dec. 13, 2007

(51) Int. Cl.
*H01L 21/2842* (2006.01)
(52) U.S. Cl. .................. 257/306; 257/330; 257/331; 257/E27.084; 257/E27.086
(58) Field of Classification Search .......... 257/E27.091, 257/296, 306–309, 311, 330–334, 906, 908, 257/E27.084
See application file for complete search history.

(56) References Cited

U.S. PATENT DOCUMENTS

| | | | |
|---|---|---|---|
| 5,270,257 A | 12/1993 | Shin | |
| 6,498,071 B2 | 12/2002 | Hijzen | |
| 6,638,826 B2 | 10/2003 | Zeng | |
| 6,770,535 B2 * | 8/2004 | Yamada et al. | 438/270 |
| 2004/0043595 A1 * | 3/2004 | Lee et al. | 438/592 |
| 2004/0169221 A1 * | 9/2004 | Ko et al. | 257/330 |

FOREIGN PATENT DOCUMENTS

KR    1020010093012 A    10/2001

* cited by examiner

*Primary Examiner*—Wai-Sing Louie
*Assistant Examiner*—Eva Y. Montalvo
(74) *Attorney, Agent, or Firm*—Harness, Dickey & Pierce, P.L.C.

(57) ABSTRACT

A semiconductor device may include a substrate having a cell active region. A cell gate electrode may be formed in the cell active region. A cell gate capping layer may be formed on the cell gate electrode. At least two cell epitaxial layers may be formed on the cell active region. One of the at least two cell epitaxial layers may extend to one end of the cell gate capping layer and another one of the at least two cell epitaxial layers may extend to an opposite end of the cell gate capping layer. Cell impurity regions may be disposed in the cell active region. The cell impurity regions may correspond to a respective one of the at least two cell epitaxial layers.

13 Claims, 6 Drawing Sheets

DRAM DEVICE WITH CELL EPITAXIAL LAYERS PARTIALLY OVERLAP BURIED CELL GATE ELECTRODE

PRIORITY STATEMENT

This U.S. non-provisional application claims benefit of priority to Korean Application Serial No. 2006-52137, filed Jun. 9, 2006, in the Korean Intellectual Property Office (KIPO), the disclosure of which is hereby incorporated herein by reference.

BACKGROUND

1. Field

Example embodiments relate to a semiconductor device and a method of fabricating the same, for example, a semiconductor device having a buried gate electrode and a method of fabricating the same.

2. Description of Related Art

As integration density of a semiconductor memory device, for example, a DRAM device, may become increased, an area occupied by a planar type MOS transistor may become gradually reduced. As a result, a length of a channel of the planar type MOS transistor may be reduced, so as to cause a short channel effect. For example, if the short channel effect occurs in a planar type access MOS transistor employed in a planar type memory cell of a DRAM device, a threshold voltage of the planar type access MOS transistor may be reduced and a leakage current may be increased, thereby deteriorating refresh characteristics of the memory cell in DRAM device.

A recess gate MOS transistor has been proposed that may increase the length of the channel relative to the planar type MOS transistor to suppress problems associated with the short channel effect, and which may increase the integration density of the DRAM device. The recess gate MOS transistor may include a recess formed in an active region of a semiconductor substrate, a gate electrode formed in the recess, and source/drain regions spaced apart by the recess and formed in the active region at both sides of the gate electrode.

However, although the recess gate MOS transistor may be employed in a DRAM device, there may be a limitation in increasing the integration density of the DRAM device due to difficulty in estimating relative locations of neighboring structures with respect to the recess gate MOS transistor in the memory cell of the DRAM cell. For example, neighboring structures may be a bit line, contacts adjacent to the recess gate MOS transistor, or a capacitor. At the present time, a recess gate MOS transistor may be formed on a smaller area in the memory cell so that sufficient space may remain in the memory cell to form neighboring structures, thereby protecting against an electrical short between the neighboring structures and the recess gate MOS transistor.

SUMMARY

Example embodiments may provide a semiconductor device that may employ a buried gate electrode, and method of fabricating the same, that may protect against an electrical short between a transistor and neighboring structures adjacent to the transistor, and may enhance the characteristics of the transistor.

In an example embodiment, a semiconductor device may include a cell active region. A cell gate electrode may be formed in the cell active region. A cell gate capping layer may be formed on the cell gate electrode. At least two cell epitaxial layers may be disposed on the cell active region. One of the at least two cell epitaxial layers may extend to one end of the cell gate capping layer and another one of the at least two cell epitaxial layers may extend to an opposite end of the cell gate capping layer. Cell impurity regions may be disposed in the cell active region. The cell impurity regions may correspond to a respective one of the at least two cell epitaxial layers.

According to an example embodiment, the semiconductor substrate may have a peripheral active region. A peripheral gate pattern may be disposed on the peripheral active region. At least two peripheral epitaxial layers may be formed on opposite sides of the peripheral gate pattern. Peripheral impurity regions may be disposed in the peripheral active region. The peripheral impurity regions may correspond to a respective one of the at least two peripheral epitaxial layers.

In an example embodiment embodiments, a method of fabricating a semiconductor device may include providing a semiconductor substrate having a cell active region; forming a cell gate electrode in the cell active region; forming a cell gate capping layer on the cell gate electrode; forming impurity regions in the cell active region at opposite sides of the cell gate electrode; and forming at least two epitaxial layers on the cell active region.

According to an example embodiment, the semiconductor substrate may have a peripheral active region. The method may further include forming a peripheral gate pattern on the peripheral active region; forming gate spacers on sidewalls of the peripheral gate pattern; forming impurity regions in the peripheral active region; and forming at least two peripheral epitaxial layers on the peripheral active region.

BRIEF DESCRIPTION OF THE DRAWINGS

Example embodiments will be described with reference to the accompanying drawings.

DESCRIPTION OF EXAMPLE EMBODIMENTS

Example embodiments will now be described more fully hereinafter with reference to the accompanying drawings. Example embodiments may, however, be embodied in different forms and should not be construed as limited to the example embodiments set forth herein. Rather, these example embodiments are provided so that this disclosure will be thorough, and will fully convey the scope to those skilled in the art. In the drawings, the thickness of layers and regions are exaggerated for clarity. Like numbers refer to like elements throughout.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 13:
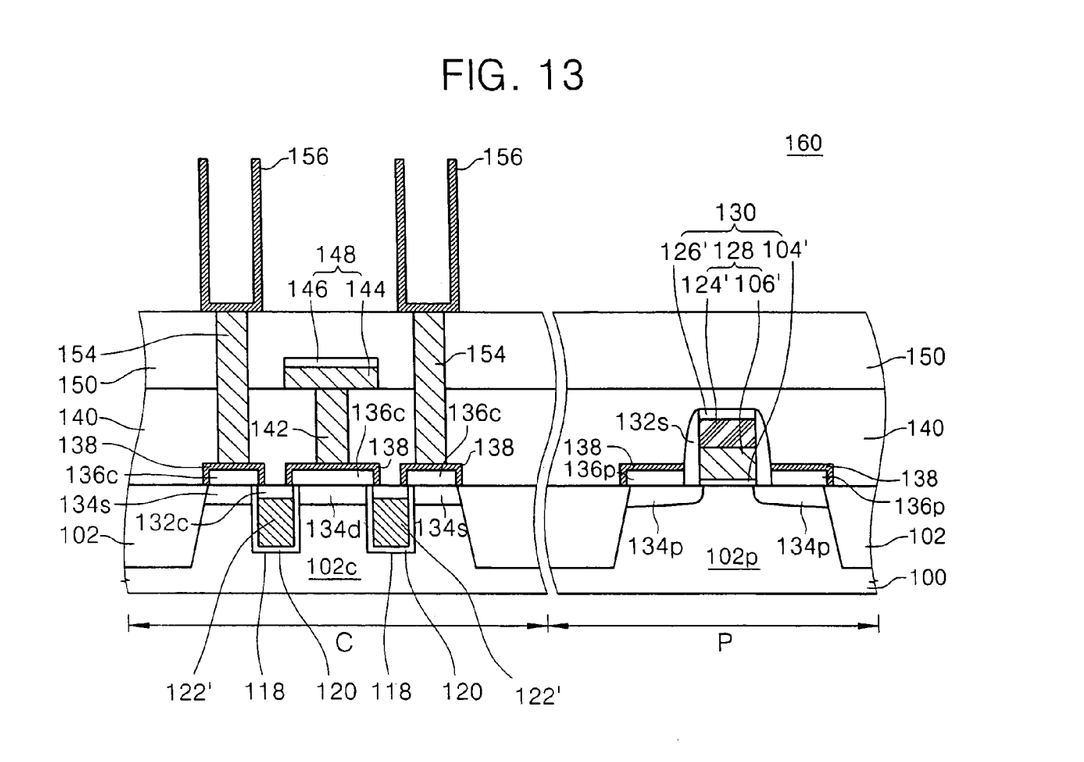

FIG. 13 is a cross sectional view showing a semiconductor device according to an example embodiment.

Referring to FIG. 13, a semiconductor device may include a semiconductor substrate 100 having a cell region C and a peripheral region P. The semiconductor substrate 100 may be a single crystal silicon substrate and may be doped with a first conductivity type impurity, for example, p-type impurity. For example, the semiconductor substrate 100 may be doped with boron (B). An isolation layer 102 may be disposed in the semiconductor substrate 100. For example, the isolation layer 102 may be formed of a silicon oxide layer. The isolation layer 102 may define cell active regions 102c and 102p in the semiconductor substrate 100. The cell active region 102c may be in the cell region C, and a peripheral active region 102p may be in the peripheral region P.

Channel recesses 118 may be disposed in the cell active region 102c. Each channel recess 118 may be formed to a predetermined or desired depth from the surface of the semiconductor substrate 100 and may be disposed to cross the cell active region 102c. Although not shown, the channel recesses 118 may also be formed in the isolation layer 102 adjacent to the cell active region 102c.

A cell gate electrode 122' may be disposed in each of the channel recesses 118. The cell gate electrodes 122' may be buried in a respective channel recess 118. The upper surfaces of the cell gate electrodes 122' may be located lower than the surface of the semiconductor substrate 100 of the cell active region 102c. For example, the cell gate electrodes 122' may be composed of polysilicon. The cell gate electrodes 122' may be doped with a second conductivity type impurity opposite to the first conductivity type, for example, n-type impurity. For example, the cell gate electrodes 122' may be doped with phosphorus (P) or arsenic (As). The cell gate electrodes 122' may be insulated from the semiconductor substrate 100 by a cell gate insulating layer 120. The cell gate insulating layer 120 may be interposed between each of the cell gate electrodes 122' and the inner wall of each of the channel recesses 118. For example, the cell gate insulating layer 120 may be silicon oxide.

The cell gate electrodes 122' may be covered by cell gate capping layers 132c. For example, the cell gate capping layers 132c may be silicon nitride, silicon oxide, or silicon oxynitride. The cell gate capping layers 132c may fill the channel recesses 118 together with the cell gate electrodes 122'. The upper surfaces of the cell gate capping layers 132c may be located at approximately the same level as the upper surface of the cell active region 102c.

Source and drain regions 134s and 134d may be disposed in the cell active region 102c on opposite sides of the channel recesses 118. The drain region 134d may be disposed between the channel recesses 118, and the source regions 134s may be spaced apart from the drain region 134d by the channel recesses 118. The source and drain regions 134s and 134d may be doped with the same conductivity type impurity as the cell gate electrodes 122'. The source and drain regions 134s and 134d, the cell gate capping layers 132c, the cell gate electrodes 122' and cell gate insulating layer 120 may comprise a cell transistor according to an example embodiment.

Cell epitaxial layers 136c may be disposed on the cell active region 102c at opposite sides of each of the channel recesses 118 on the source and drain regions 134s and 134d. The cell epitaxial layers 136c may be single crystal silicon epitaxially formed on the surface of the cell active region 102c, and may extend onto the cell gate capping layers 132c so as to partially overlap the cell gate electrodes 122'. The cell epitaxial layers 136c, which may extend onto the cell gate capping layers 132c, may also extend onto the isolation layer 102. In this case, the respective areas of the upper surfaces of the cell epitaxial layers 136c may be greater than the areas of the upper surfaces of the source and drain regions 134s and 134d. The cell epitaxial layers 136c may be doped with the same conductivity type impurity as the source and drain regions 134s and 134d.

A peripheral gate pattern 130 may be disposed on the peripheral active region 102p. The peripheral gate pattern 130 may include a peripheral gate insulating layer 104', a peripheral gate electrode 128, and/or a peripheral gate capping layer 126', which may be sequentially stacked on the peripheral active region 102p. The peripheral gate electrode 128 may include a polysilicon layer 106' and a metal layer pattern 124', which may be sequentially stacked. The metal layer pattern 124' may be metal silicide, for example, tungsten silicide.

Peripheral impurity regions 134p may be disposed in the peripheral active region 102p at opposite sides of the peripheral gate pattern 130. The peripheral impurity regions 134p may be doped with the same conductivity type impurity as the source and drain regions 134s and 134d or with a different conductivity type impurity from the source and drain regions 134s and 134d.

Gate spacers 132s may be disposed on sidewalls of the peripheral gate pattern 130. The gate spacers 132s may be composed of the same material layer as the cell gate capping layers 132c, and may be, for example, silicon nitride, silicon oxide, silicon oxynitride, etc. The peripheral impurity regions 134p, the gate spacers 132s and the peripheral gate pattern 130 may comprise a peripheral transistor according an example embodiment.

Peripheral epitaxial layers 136p may be disposed on the peripheral active regions 102p at opposite sides of the peripheral gate pattern 130. The peripheral epitaxial layers 136p may be formed using the same epitaxial process as the cell epitaxial layers 136c, and may be single crystal silicon. The peripheral epitaxial layers 136p may be doped with the same conductivity type impurity as the cell epitaxial layers 136c. Metal silicide layers 138 may be disposed on the cell epitaxial layers 136c and the peripheral epitaxial layers 136p. For example, the metal silicide layers 138 may be composed of tungsten silicide, nickel silicide, cobalt silicide, titanium silicide, tantalum silicide, etc.

A first interlayer insulating layer 140 may be disposed on the semiconductor substrate 100 having the peripheral gate pattern 130 and the metal silicide layers 138. A first contact plug 142 may penetrate the first interlayer insulating layer 140 and contact a bit line pattern 148, which may be disposed on the first interlayer insulating layer 140. The first contact plug 142 may electrically connect the bit line pattern 148 to the metal silicide layers 138. The bit line pattern 148 may include a bit line conductive layer pattern 144 and a bit line capping layer pattern 146, which may be sequentially stacked. A second interlayer insulating layer 150 may be disposed on the first interlayer insulating layer 140 and may cover the bit line pattern 148. A second contact plug 154 may be disposed to penetrate the second interlayer insulating layer 150 and the first interlayer insulating layer 140. The second contact plug 154 may contact storage node electrodes 156, which may be disposed on the second interlayer insulating layer 150. The second contact plug 154 may electrically connect the storage node electrodes 156 to respective metal silicide layers 138. The peripheral and cell transistors, together with the storage node electrodes 156, may comprise a semiconductor device 160 according to an example embodiment.

As described above, the cell gate electrodes 122' may be buried in the channel recesses 118. By burying the cell gate electrodes 122' in the channel recesses 118, an effective channel length of the cell transistor may be increased, which may prevent a short channel effect of the cell transistor. The cell epitaxial layers 136c may be disposed on the source and drain regions 134s and 134d. The cell epitaxial layers 136c may also extend onto the cell gate capping layers 132c so as to partially overlap the cell gate electrodes 122', and may also extend onto the isolation layer 102. As a result, an upper surface area of the cell epitaxial layers 136c may be greater than the surface area of the source and drain regions 134s and 134d. An electrical short between the cell gate electrodes 122' and the source and drain regions 134s and 134d may be prevented because the cell transistor and neighboring structure may only have an electrical path through the source and drain regions 134s and 134d. As a result, there may not be a limitation in estimating relative locations among the cell transistors and the neighboring structures, and the integration density of the semiconductor device 160 may be increased.

FIGS. 1 through 13 are cross sectional views of a method of fabricating a semiconductor device according to an example embodiment.

Figure 1:
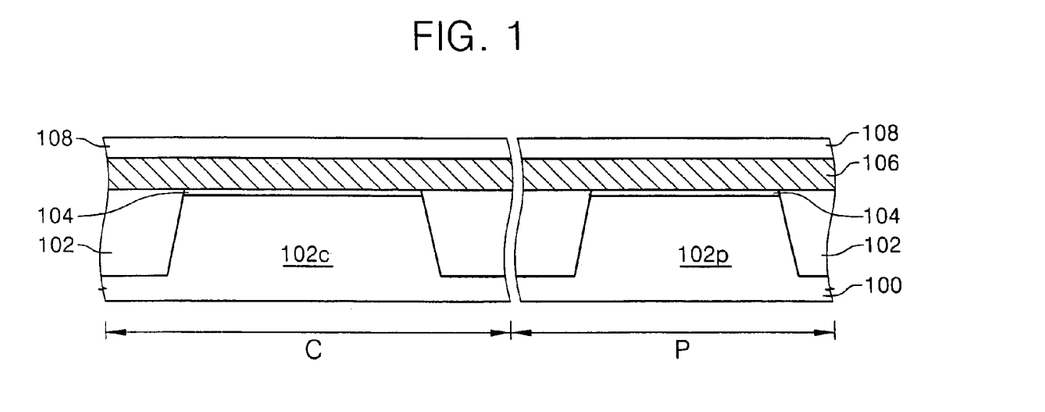
FIGS. 1 through 13 are cross sectional views of a method of fabricating a semiconductor device according to an example embodiment.

Referring to FIG. 1, a semiconductor substrate 100 having a cell region C and a peripheral region P may be provided. The semiconductor substrate 100 may be single crystal silicon, and may be doped with a first conductivity type impurity, for example, a p-type impurity. For example, the semiconductor substrate 100 may be doped with boron (B). An isolation layer 102 may be formed in the semiconductor substrate 100. For example, the isolation layer 102 may be formed using a well-known shallow trench isolation process, and may be formed of silicon oxide, for example, high density plasma (HDP) oxide. The isolation layer 102 may define a cell active region 102c in the cell region C of the semiconductor substrate 100 and a peripheral active region 102p in the peripheral region P of the semiconductor substrate 100.

A buffer insulating layer 104 may be formed on the semiconductor substrate 100 having the isolation layer 102. For example, the buffer insulating layer 104 may be formed of silicon oxide using a thermal oxidation process or of a high-k dielectric material, for example, metal oxide, metal oxynitride, metal silicate, etc. A first conductive layer 106 may be formed on the semiconductor substrate 100. The first conductive layer 106 may be formed of polysilicon and may be doped with a second conductivity type impurity, for example, an n-type impurity. For example, the polysilicon layer may be formed using a chemical vapor deposition (CVD) process, and may be doped with a second conductivity type impurity during the deposition process in-situ or by an ion implantation process. For example, the first conductive layer 106 may be doped with phosphorus (P) or arsenic (As). A first mask layer 108 may be formed on the first conductive layer 106. The first mask layer 108 may be formed of insulating material, for example, silicon nitride.

Figure 2:
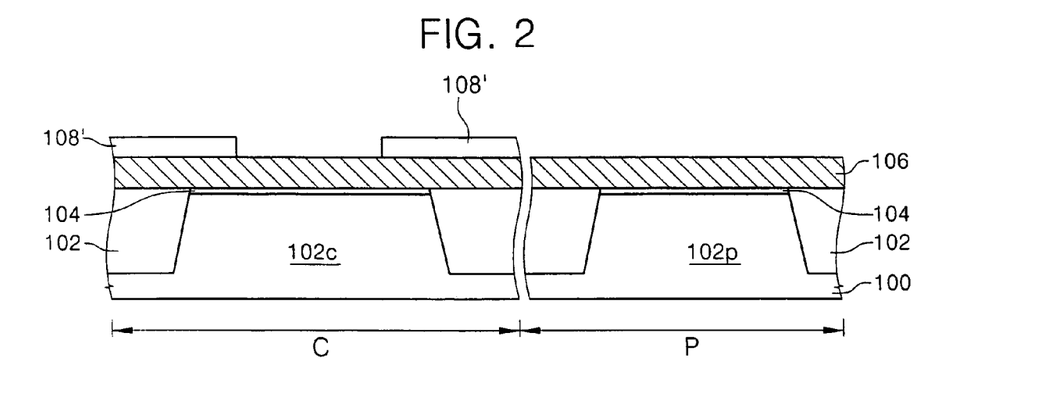

Referring to FIG. 2, the first mask layer 108 may be patterned to form a first mask pattern 108'. For example, the first mask layer 108 may be patterned using well-known photolithography and etch processes. In the cell region C, the first mask pattern 108' may expose a portion of the first conductive layer 106 over the cell active region 102c. In the peripheral region P, the first mask layer 108 may be removed to expose the first conductive layer 106.

Figure 3:
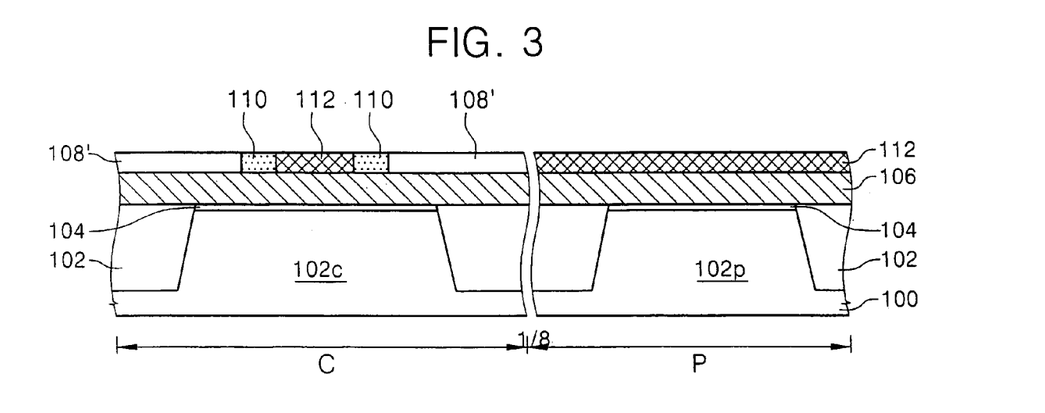

Referring to FIG. 3, spacers 110 may be formed to cover sidewalls of the first mask pattern 108'. The spacers 110 may be formed by forming an insulating layer (not shown) on a semiconductor substrate 100 having the first mask pattern 108', and anisotropically etching the entire surface of the insulating layer. The first mask pattern 108' and the spacers 110 may be continuous and may entirely cover the first conductive layer 106 of the cell region, but the first conductive layer 106 in the peripheral region P may not have the first mask pattern 108' or spacers 110. The spacers 110 may be formed of material having a higher etch rate than the first mask pattern 108'. For example, the spacers 110 may be formed of silicon oxide or polysilicon.

A second mask layer (not shown) may be formed on a semiconductor substrate 100 having the spacers 110. For example, the second mask layer may be formed of material having a lower etch rate than the spacers 110 or of the same material as the first mask layer 108. For example, the second mask layer may be formed of insulating material, for example, silicon nitride. The second mask layer may be planarized to expose the upper surfaces of the spacers 110 and the first mask pattern 108'. As a result, a second mask pattern 112 may be formed between the spacers 110 in the cell region C and may cover the first conductive layer 106 in the peripheral region P. The second mask pattern 112 may be formed using a chemical mechanical polishing (CMP) process or an etch-back process.

Figure 4:
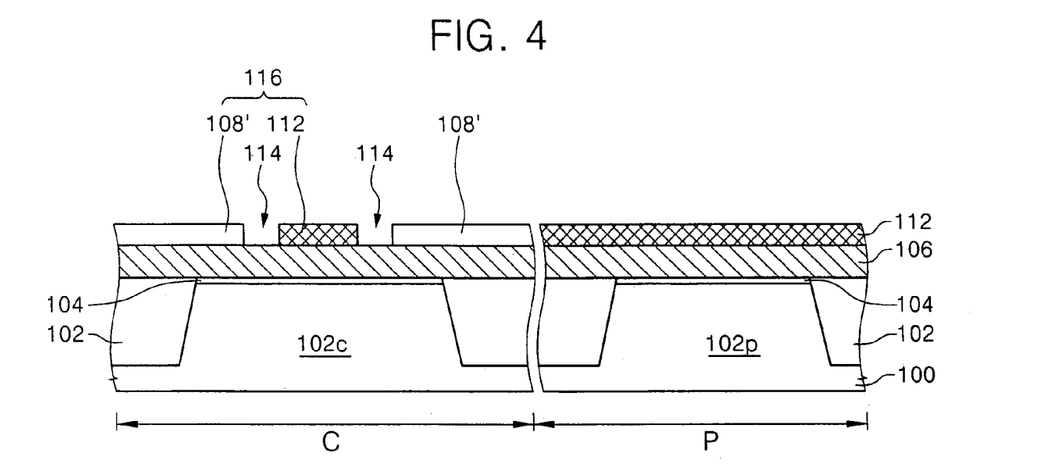

Referring to FIG. 4, the spacers 110 may be removed to form a mask pattern 116 on the first conductive layer 106 of the cell region C. The mask pattern 116 may not be formed across the cell active region 102c. In this case, the spacers 110 may be removed by a wet etch process using a solution including hydrofluoric acid (HF) as etchant. The mask pattern 116 may include the first mask pattern 108' and the second mask pattern 112.

Figure 5:
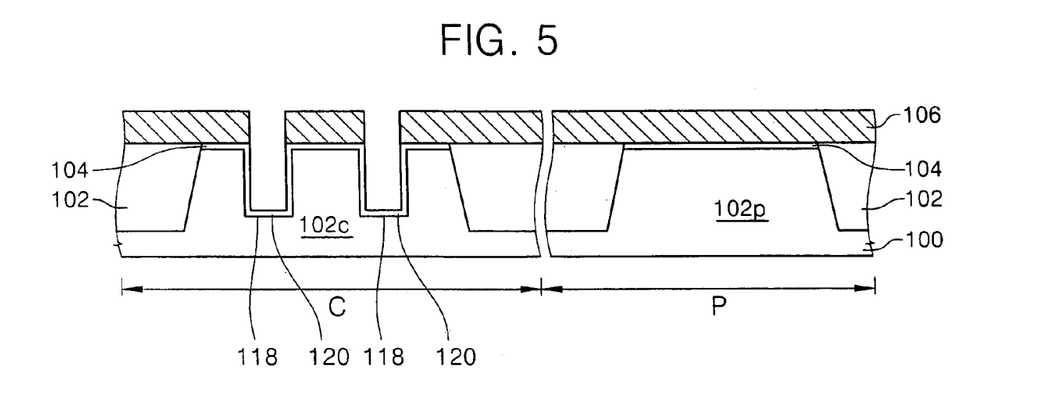

Referring to FIG. 5, the first conductive layer 106 and the semiconductor substrate 100 may be etched using the mask pattern 116 as an etch mask to form channel recesses to a predetermined or desired depth. The channel recesses 118 may be formed in the cell active region 102c. The mask pattern 116 may be removed during the etching of the semiconductor substrate 100. Although not shown, the channel recesses 118 may extend beyond the cell active region 102c into the isolation layers 102 adjacent to the cell active region 102c.

A cell gate insulating layer 120 may be formed on inner sidewalls of the channel recesses 118. For example, the cell gate insulating layer 120 may be formed of silicon oxide using a thermal oxidation process or of a high-k dielectric material, for example, metal oxide, metal oxynitride, or metal silicate, using a CVD process or an atomic layer deposition (ALD) process. Although not shown, the cell gate insulating layer 120 may also be formed on the upper surface of the first conductive layer 106.

Figure 6:
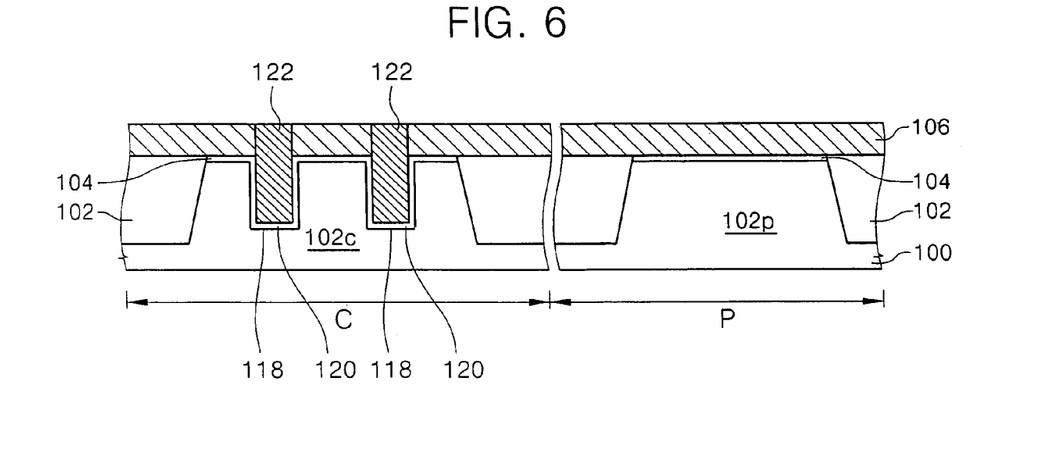

Referring to FIG. 6, a second conductive layer (not shown) may be formed on the semiconductor substrate 100 having the cell gate insulating layer 120. The second conductive layer may be formed on the first conductive layer 106 to fill the channel recesses 118. For example, the second conductive layer may be formed of polysilicon using a CVD process, and may be doped with the same conductivity type impurity as the first conductive layer 106 using an ion implantation process.

The second conductive layer may be planarized to form a second conductive layer pattern 122 in the channel recesses 118. The second conductive layer pattern 122 may be planarized using a CMP process or an etch-back process, and may expose the upper surface of the first conductive layer 106. The upper surface of the second conductive layer pattern 122 may formed at approximately the same level as the upper surface of the first conductive layer 106. The cell gate insulating layer 120 on the first conductive layer 106 may be removed during the planarizing of the second conductive layer.

Figure 7:
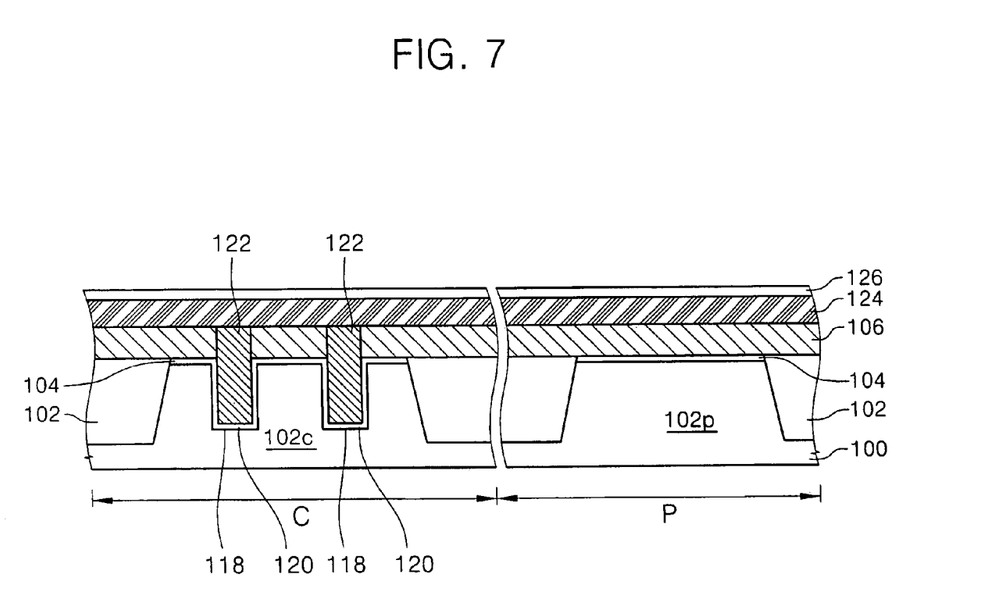

Referring to FIG. 7, a third conductive layer 124 and a capping insulating layer 126 may be sequentially formed on the first conductive layer 106 and the second conductive layer pattern 122. The third conductive layer 124 may be formed of metal, for example, tungsten, or metal silicide, for example, tungsten silicide. The capping insulating layer 126 may be formed of silicon nitride.

Figure 8:
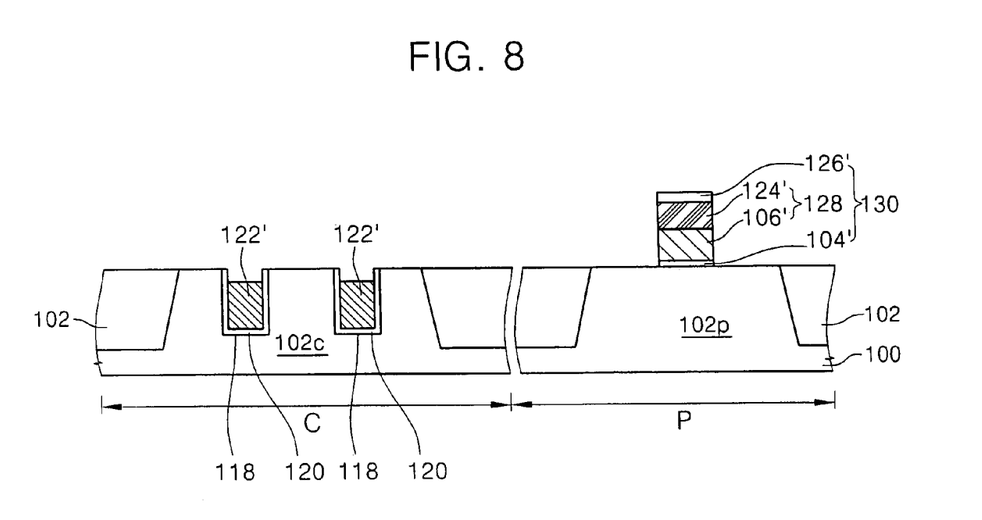

Referring to FIG. 8, the capping insulating layer 126, the third conductive layer 124, and the first conductive layer 106 may be patterned to form a peripheral gate pattern 130 on the peripheral active region 102p. The peripheral gate pattern 130 may include a peripheral gate electrode 128 and a peripheral gate capping layer 126', which may be sequentially stacked. The peripheral gate electrode 128 may include a first conductive layer pattern 106' and a third conductive layer pattern 124', which may be sequentially stacked. The buffer insulating layer 104 may be also patterned while the peripheral gate pattern 130 is formed to form a peripheral gate insulating layer 104' between the peripheral gate electrode 128 and the peripheral active region 102p. The peripheral gate pattern 130 may include the peripheral gate insulating layer 104', the peripheral gate electrode 128, and/or the peripheral gate capping layer 126', which may be sequentially stacked on the peripheral active region 102p.

The capping insulating layer 126, the third conductive layer 124, and the first conductive layer 106 on the cell active region 102c may be removed, or example, during the forming of the peripheral gate pattern 130. The second conductive layer patterns 122 may be recessed into the channel recesses 118 by performing an over-etch process on the peripheral gate pattern 130. As a result, cell gate electrodes 122' may be formed which are buried in the channel recesses 118. For example, upper surfaces of the cell gate electrodes 122' may be formed at a lower level than the upper surfaces of the cell active region 102c.

Figure 9:
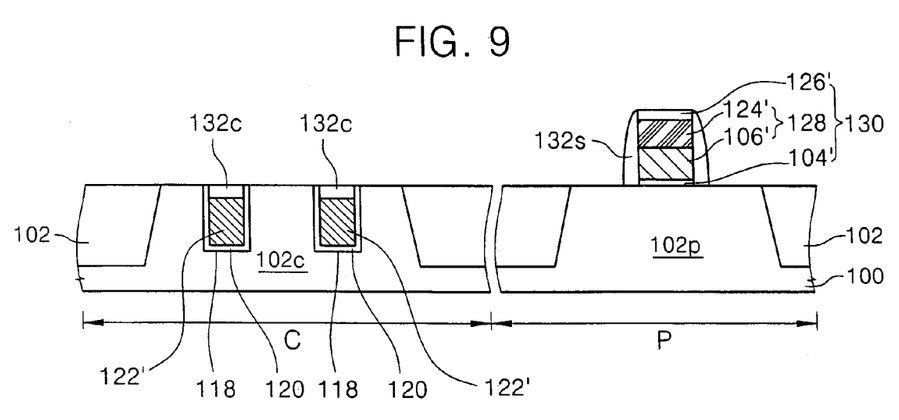

Referring to FIG. 9, an insulating layer (not shown) may be formed on the semiconductor substrate 100 having the peripheral gate pattern 130 and the cell gate electrodes 122'. For example, the insulating layer may be formed of silicon nitride, silicon oxide, silicon oxynitride, etc. The entire surface of the insulating layer may be anisotropically etched to form cell gate capping layers 132c and gate spacers 132s. The gate spacers 132s may be formed to cover sidewalls of the peripheral gate pattern 130 and the cell gate capping layers 132c may be formed to cover the upper surfaces of the cell gate electrodes 122' and fill the channel recesses 118 above the cell gate electrodes 122'. The upper surfaces of the cell gate capping layers 132c may be formed at approximately the same level as that of the cell active region 102c.

Figure 10:
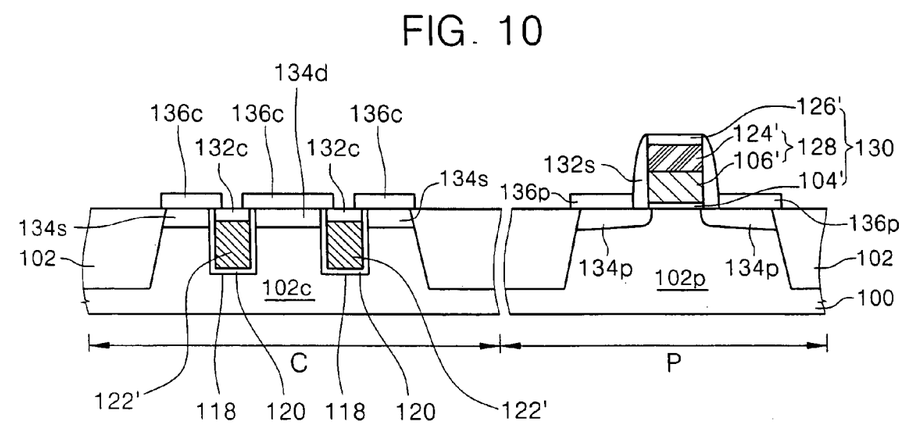

Referring to FIG. 10, impurity ions may be implanted into the semiconductor substrate 100, using the peripheral gate pattern 130, the gate spacers 132s, and the cell gate capping layers 132c as a mask. As a result, a drain region 134d may be formed in the cell active region 102c between the channel recesses 118, and source regions 134s may be formed in the cell active region 102c spaced from the drain region 134d by the channel recesses 118. Peripheral impurity regions 134p may be formed in the peripheral active region 102p on opposite sides of the peripheral gate pattern 130. For example, the source and drain regions 134s and 134d may have the same conductivity type impurity as the peripheral impurity regions 134p or have a different conductivity type impurity from the peripheral impurity regions 134p.

The source and drain regions 134s and 134d may be formed concurrently with the peripheral impurity regions 134p. Alternatively, the source and drain regions 134s and 134d, and the peripheral impurity regions 134p may be not concurrently formed. For example, the source and drain regions 134s and 134d may be formed using a first photoresist layer covering the peripheral region 102p as a mask. The peripheral impurity regions 134p may be formed using a second photoresist layer covering the cell region 102c as a mask.

Cell epitaxial layers 136c may be formed on the upper surfaces of the source and drain regions 134s and 134d by a selective epitaxial process. The cell epitaxial layers 136c may be single crystal silicon. The cell epitaxial layers 136c may extend onto the cell gate capping layers 132c to partially overlap the cell gate electrodes 122', and may extend onto the isolation layer 102. Thus, the upper surface areas of the cell epitaxial layers 136c may be greater than the upper surface areas of the source and drain regions 134s and 134d, respectively.

Peripheral epitaxial layers 136p may be formed on the peripheral impurity regions 134p. The peripheral epitaxial layers 136p may be formed together with the cell epitaxial layers 136c. The cell epitaxial layers 136c and the peripheral epitaxial layers 136p may be doped with the same conductivity type impurity during the formation of the epitaxial layers 136c and 136p. Alternatively, the cell epitaxial layers 136c and the peripheral epitaxial layers 136p may be doped by using an ion implantation process after the formation of the epitaxial layers 136c and 136p. For example, the ion implantation process may be performed using the first and second photoresist layers to form the source region 134s, the drain region 134d and the peripheral impurity regions 134p.

Figure 11:
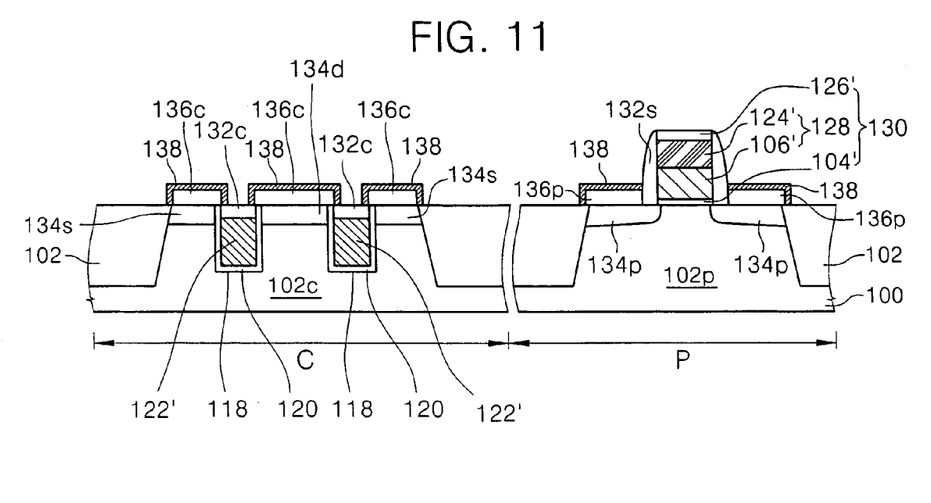

Referring to FIG. 11, metal silicide layers 138 may be formed on the cell and peripheral epitaxial layers 136c and 136p. For example, the metal silicide layers 138 may be formed using a well-known salicide process, and may be composed of, for example, tungsten silicide, nickel silicide, cobalt silicide, titanium silicide, tantalum silicide, etc.

Figure 12:
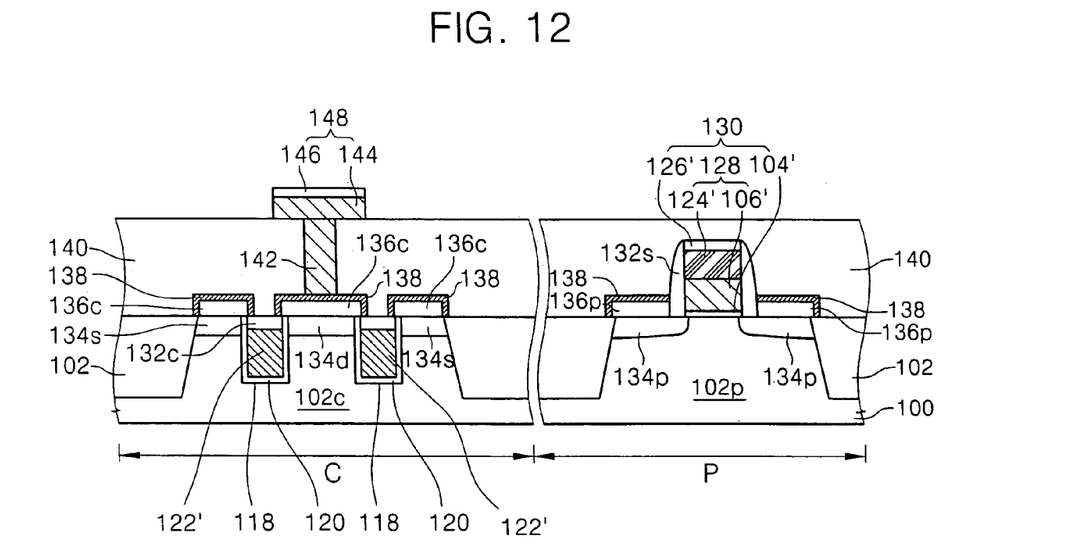

Referring to FIG. 12, a first interlayer insulating layer 140 may be formed on the semiconductor substrate 100 having the metal silicide layers 138. For example, the first interlayer insulating layer 140 may be formed of silicon oxide. A first hole may be formed in the first interlayer insulating layer 140 to expose the metal silicide layers 138 formed on the cell epitaxial region in the drain region 134d. The first hole may be filled with a first contact plug 142. The first contact plug 142 may contact the metal silicide layer 138 on the drain region 134d. A bit line pattern 148 may be formed on the first interlayer insulating layer 140 contacting the first contact plug 142. The bit line pattern 148 may be formed by sequentially forming a bit line conductive layer and a bit line capping layer on the first interlayer insulating layer 140, and sequentially patterning the bit line capping layer and the bit line conductive layer to form a bit line conductive layer pattern 144 and a bit line capping layer pattern 146.

Referring to FIG. 13, a second interlayer insulating layer 150 may be formed on the first interlayer insulating layer 140 to cover the bit line pattern 148. For example, the second interlayer insulating layer 150 may be formed of silicon oxide. Second holes may be formed through the second interlayer insulating layer 150 and first interlayer insulating layer 140 to expose the metal silicide layers 138 formed on the cell epitaxial regions 136c in the source regions 134s. The second holes may be filled with second contact plugs 154 that may contact the metal silicide layers 138. Storage node electrodes 156 may be formed on the second interlayer insulating layer 150 and may contact the second contact plugs 154.

The source and drain regions 134s and 134d, the cell gate capping layers 132c, the cell gate electrodes 122' and cell gate insulating layer 120 may comprise a cell transistor according to an example embodiment. The peripheral impurity regions 134p, the gate spacers 132s and the peripheral gate pattern 130 may comprise a peripheral transistor according to an example embodiment. The peripheral and cell transistors together with the storage node electrodes 156 may comprise a semiconductor device 160 according to an example embodiment.

Figure 14:
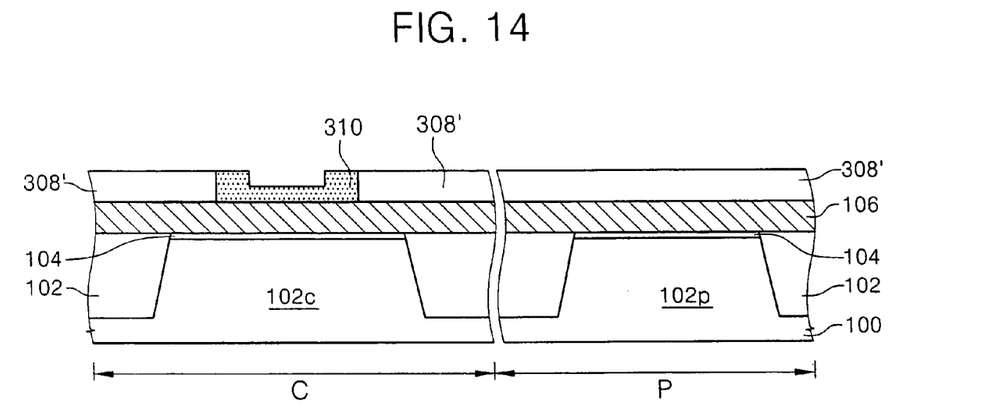
FIGS. 14 through 16 are sectional views of a method of fabricating a semiconductor device according to another example embodiment.
Figure 15:
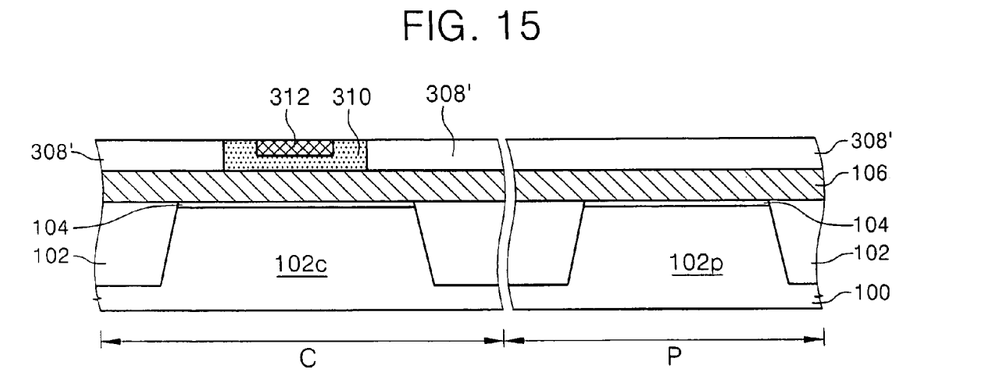
Figure 16:
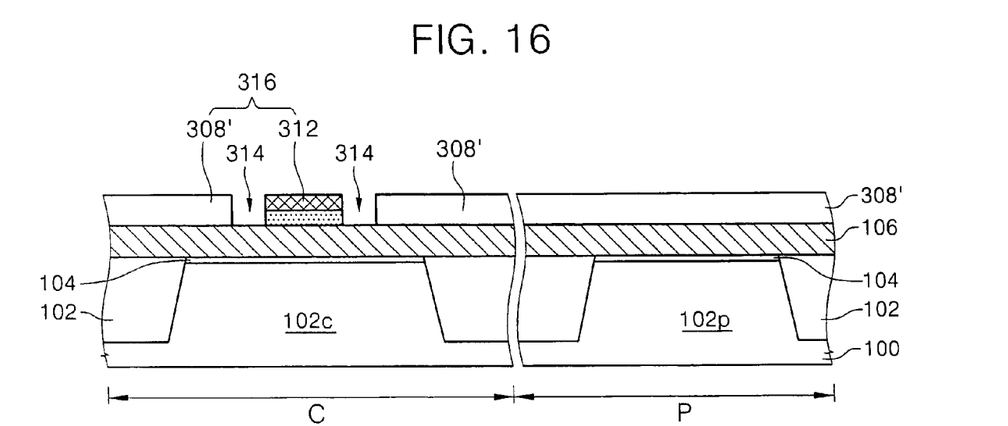

FIGS. 14 through 16 are sectional views illustrating a method of fabricating a semiconductor device according to another example embodiment.

Referring to FIG. 14, a conductive layer 106 may be formed on the semiconductor substrate as shown in FIG. 1. A first mask layer may be formed on the conductive layer 106. The first mask layer may be patterned to form a first mask pattern 308'. In cell region C, the first mask pattern 308' may be formed to have an opening exposing a portion of the first conductive layer 106 over the cell active region 102c. However, in peripheral region P, the first mask pattern 308' may cover the first conductive layer 106 of the peripheral region P.

An insulating layer (not shown) may be conformally formed on the semiconductor substrate 100 having the first mask pattern 308'. The insulating layer may be patterned to expose the upper surface of the first mask pattern 308'. As a result, an insulating layer pattern 310 may be formed that may conformally cover the sidewalls of the opening in the first mask pattern 308' and the portion of the first conductive layer 106 which is exposed by the opening in the first mask pattern 308'. The insulating layer may be formed of material having a higher etch rate than the first mask pattern 308'. For example, the first mask pattern 308' may be formed of silicon nitride, and the insulating layer may be formed of silicon oxide or polysilicon.

Referring to FIG. 15, a second mask layer (not shown) may be formed on the semiconductor substrate 100 having the insulating layer pattern 310. The second mask layer may be formed of the same material as the first mask pattern 308'. The second mask layer may be planarized to expose the first mask pattern 308', thereby forming a second mask pattern 312 on the insulating layer pattern 310 that may expose a portion of the insulating layer pattern 310 on the sidewalls of the first insulating layer pattern 308'.

Referring to FIG. 16, the insulating layer pattern 310 may be etched, using the first mask pattern 308' and the second mask pattern 312 as a mask. The insulating layer pattern 310 may be etched to expose the first conductive layer 106, using a dry anisotropic etch process. As a result, a mask pattern 316 may be formed on the first conductive layer 106 that may include the first mask pattern 308', the second mask pattern 312, and/or the remaining portion of the insulating layer pattern 310 disposed between the second mask pattern 312 and the first conductive layer 106. The mask pattern 316 may have an opening 314 that crosses the cell active region 102c.

The processes described above in accordance with FIGS. 5 through 13 may be performed on a semiconductor substrate 100 having a mask pattern 316 according to an example embodiment as shown in FIG. 16.

As described above, according to example embodiments, a semiconductor device that may employ a buried gate electrode, and method of fabricating the same, may protect against an electrical short between a transistor and neighboring structures adjacent to the transistor, and may enhance the characteristics of the transistor.

What is claimed is:
1. A semiconductor device comprising:
    a semiconductor substrate having a cell active region;
    a cell gate electrode formed in the cell active region;
    a cell gate capping layer formed on the cell gate electrode;
    at least two cell epitaxial layers disposed on the cell active region, one of the at least two cell epitaxial layers extending to one end of the cell gate capping layer and another one of the at least two cell epitaxial layers extending to an opposite end of the cell gate capping layer; and cell impurity regions disposed in the cell active region, the cell impurity regions corresponding to a respective one of the at least two cell epitaxial layers, wherein the at least two cell epitaxial layers extend onto the cell gate capping layer so as to partially overlap the cell gate electrode.

2. The semiconductor device of claim 1, wherein an upper surface of the cell gate capping layer is disposed at the same level as the upper surface of the cell active region.

3. The semiconductor device of claim 1, further comprising a cell gate insulating layer formed in the cell active region around the cell gate electrode and the cell gate capping layer.

4. The semiconductor device of claim 1, further comprising metal silicide layers disposed on the at least two cell epitaxial layers.

5. The semiconductor device of claim 4, further comprising an insulating layer disposed on the semiconductor substrate to cover the cell gate capping layer and the metal silicide layers.

6. The semiconductor device of claim 5, further comprising:
    storage node electrodes formed on the insulating layer; and
    contact plugs penetrating the insulating layer to electrically connect the storage node electrodes to the metal silicide layers.

7. The semiconductor device of claim 5, further comprising:
    a bit line formed on the insulating layer; and
    a contact plug penetrating the insulating layer to electrically connect the bit line to the metal silicide layer formed on one of the at least two cell epitaxial layers.

8. The semiconductor device of claim 7, where in the bit line includes:
    a bit line conductive layer formed on the insulating layer; and
    a bit line capping layer formed on the bit line conductive layer.

9. The semiconductor device of claim 1, wherein the semiconductor substrate has a peripheral active region, further comprising:
    a peripheral gate pattern disposed on the peripheral active region;
    at least two peripheral epitaxial layers formed on opposite sides of the peripheral gate pattern; and
    peripheral impurity regions disposed in the peripheral active region, the peripheral impurity regions corresponding to a respective one of the at least two peripheral epitaxial layers.

10. The semiconductor device of claim 9, further comprising gate spacers disposed on the peripheral active region between the peripheral gate pattern and the at least two peripheral epitaxial layers, the gate spacers covering sidewalls of the peripheral gate pattern.

11. The semiconductor device of claim 9, wherein the peripheral gate pattern includes:
    a peripheral gate insulating layer formed on the peripheral region;
    a peripheral gate electrode formed on the peripheral gate insulating layer; and
    a peripheral capping layer formed on the peripheral gate electrode.

12. The semiconductor device of claim 9, further comprising metal silicide layers disposed on the at least two peripheral epitaxial layers.

13. The semiconductor device of claim 12, further comprising an insulating layer disposed on the semiconductor substrate to cover the metal silicide layers and the peripheral gate pattern.

* * * * *